(12) United States Patent
Jacobson et al.

(10) Patent No.: US 7,858,428 B1
(45) Date of Patent: *Dec. 28, 2010

(54) METHOD FOR FORMING A LENS USING SUB-MICRON HORIZONTAL TIP FEATURE

(75) Inventors: Lee James Jacobson, Cape Elizabeth, ME (US); Andre' Paul Labonte', Lewiston, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 1137 days.

This patent is subject to a terminal disclaimer.

(21) Appl. No.: 11/179,059

(22) Filed: Jul. 11, 2005

(51) Int. Cl.
*H01L 21/00* (2006.01)
(52) U.S. Cl. .................. 438/65; 438/57; 438/64
(58) Field of Classification Search .......... 438/514, 438/400, 57, 64, 65; 257/E21.334
See application file for complete search history.

(56) References Cited

U.S. PATENT DOCUMENTS

| | | | | |
|---|---|---|---|---|
| 5,077,227 A | * | 12/1991 | Kameyama et al. | 438/365 |
| 5,538,917 A | * | 7/1996 | Kunitou | 438/443 |
| 5,888,880 A | * | 3/1999 | Gardner et al. | 438/424 |
| 6,071,793 A | * | 6/2000 | Peidous et al. | 438/424 |
| 6,271,575 B1 | * | 8/2001 | Peidous | 257/586 |
| 7,175,777 B1 | * | 2/2007 | Labonte et al. | 216/59 |
| 2002/0076920 A1 | * | 6/2002 | Kim | 438/637 |
| 2002/0175144 A1 | * | 11/2002 | Hung et al. | 216/67 |
| 2003/0003647 A1 | * | 1/2003 | Dennison et al. | 438/238 |
| 2004/0184703 A1 | | 9/2004 | Bakir et al. | |

FOREIGN PATENT DOCUMENTS

JP    362200731 A * 9/1987 .................. 438/611

OTHER PUBLICATIONS

VLSI Fabrication Principles Silicon and Gallium Arsenide, second edition, John Wiley & Sons Inc. 1994, pp. 420-423.*

* cited by examiner

*Primary Examiner*—Bradley K Smith

(57) ABSTRACT

A method for creating graded or tapered dopant profiles in a semiconductor layer or layers. Preferably, a sub-micron horizontal tip feature is used to control the doping of the layer beneath the feature.

23 Claims, 4 Drawing Sheets

METHOD FOR FORMING A LENS USING SUB-MICRON HORIZONTAL TIP FEATURE

CROSS-REFERENCE TO RELATED APPLICATIONS

The present application contains some subject matter, figures, and text in common with, but is otherwise unrelated to, commonly-assigned application Ser. No. 10/726,122 filed Dec. 2, 2003, which is hereby incorporated by reference.

TECHNICAL FIELD OF THE INVENTION

The present invention is generally directed to semiconductor processing and, in particular, to semiconductor doping techniques.

BACKGROUND OF THE INVENTION

One important part of semiconductor processing is adjusting the electrical properties of various semiconductor layers by doping the layer at specific points to alter its electrical characteristics.

As the size of semiconductor parts shrink, it becomes increasingly important to be able to dope a semiconductor with great accuracy, and to be able to "fine tune" the doping process.

Therefore, there is a need in the art for an improved method for dopant profile tuning.

SUMMARY OF THE INVENTION

A preferred embodiment includes a method for creating graded or tapered dopant profiles in a semiconductor layer or layers. Preferably, a sub-micron horizontal tip feature is used to control the doping of the layer beneath the feature.

To address the above-discussed deficiencies of the prior art, it is an object of the present invention to provide a method of creating a horizontal tip feature in a layer of tip material, comprising using an etch process to create an etch feature in the layer of tip material, the etch feature having a substantially vertical sidewall, and the etch process having a slower etch rate near the sidewall; and stopping the etch process in order to form a portion of the substantially vertical sidewall and a horizontal tip feature adjacent to the portion of the sidewall. In some embodiments, forming the horizontal feature of tip material comprises using an etch process to create an etch feature in the layer of tip material, the etch feature having a substantially vertical sidewall, and the etch process having a slower etch rate near the sidewall; and stopping the etch process in order to form a portion of the substantially vertical sidewall and a horizontal tip feature adjacent to the portion of the sidewall.

According to another embodiment of the present invention, there is provided semiconductor structure, comprising a substrate of a first material; a layer of a second material adjacent the substrate; and an etch feature in the layer of a second material, the etch feature having sidewalls substantially perpendicular to the substrate and a sharp tip feature adjacent the sidewalls and substrate, such that the dimension of a mask feature defined by the sharp tip feature is smaller than the minimum dimension of the photolithographic process used to create the etch feature, wherein a portion of the substrate beneath the sharp tip feature contains a dopant that varies in concentration with the thickness of the overlying sharp tip feature.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged processing system.

Figure 1:
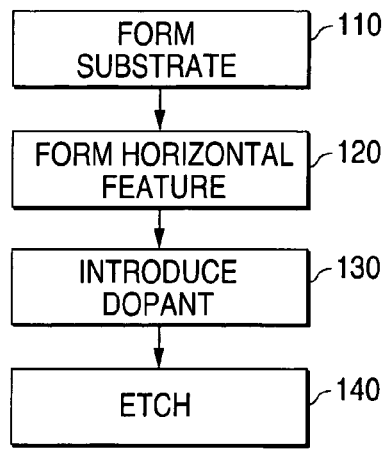
FIG. 1 is a cross-section of an etch feature of the prior art.

FIG. 1 depicts a flowchart of a process in accordance with a preferred embodiment.

First, a substrate layer is formed, using conventional method (step 110). Of course, this layer need not be the base or bottom layer of the entire semiconductor structure; the term "substrate layer" is used here to indicate the layer to be doped.

Next, a horizontal feature is formed (step 120), preferably using a technique as described below. The thickness and material of the horizontal feature will in part control the doping of the substrate layer.

Next, a dopant is introduced (step 130), using conventional doping techniques. The dopant is applied to the horizontal feature, and can also be applied to the substrate layers and other layers.

Finally, an optional etch step can be performed (step 140), to remove the horizontal feature now that the finely-tuned doping of the substrate layer has been performed.

Of course, this flowchart only describes the steps taken to perform a doping in accordance with an exemplary embodiment.

Figure 2:
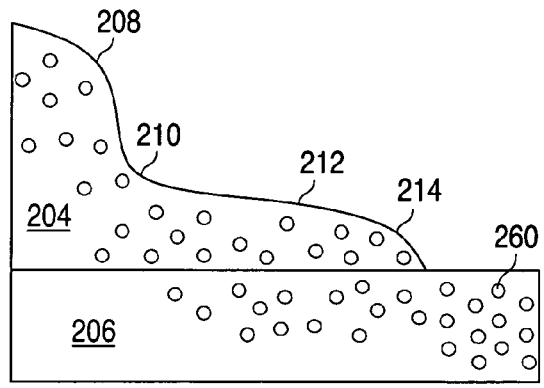
FIG. 2 is a cross-section showing the etch feature of FIG. 1 with spacers formed along the sidewalls in accordance with the prior art.

FIG. 2 depicts a semiconductor profile, in accordance with a preferred embodiment, of tip material 204 and substrate 206, that includes a sharp horizontal feature 210, used for performing the tuned doping process. This feature 210 can have a base 212 along a substantially vertical sidewall 208 of the pit, and can have a tip point 214 or edge point opposite the base 212.

Shown here, in an exaggerated and exemplary form, are dopants 260, which have been introduced using any conventional method into tip material 204 and substrate 206. As illustrated, at sidewall 208, the tip material 204 contains most or all of the dopant. As the horizontal feature 210 narrows, more of the dopant 260 is introduced into the substrate 206. In this way, the tip feature 210 of tip material 204 allows the amount of dopant introduces to the substrate to be finely tuned according to the thickness of the tip feature 210 itself. In some embodiments, as described below, the horizontal feature 210 is less than one micron thick. Because the thickness of horizontal feature 210 can be so carefully controlled, the doping of substrate 206 is very precise.

The doping process itself can be performed using conventional doping methods and dopants, including but not limited to boron, arsenic, phosphorus, and antimony, as necessary to achieve the desired electrical characteristics in the substrate 206.

Figure 3A:
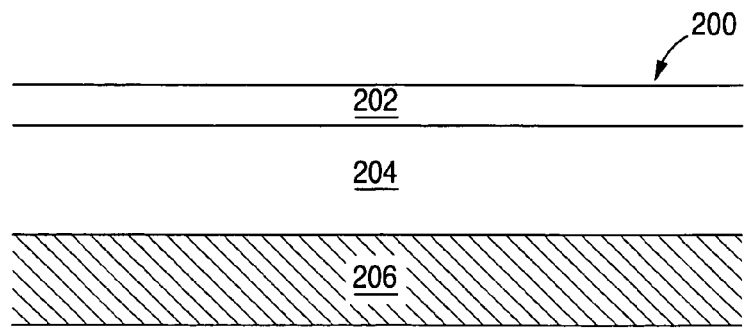
FIG. 3 is a cross-section showing a process in accordance with one embodiment of the present invention, showing stages (a) before the etch, (b) during the etch, and (c) after the etch.
Figure 3B:
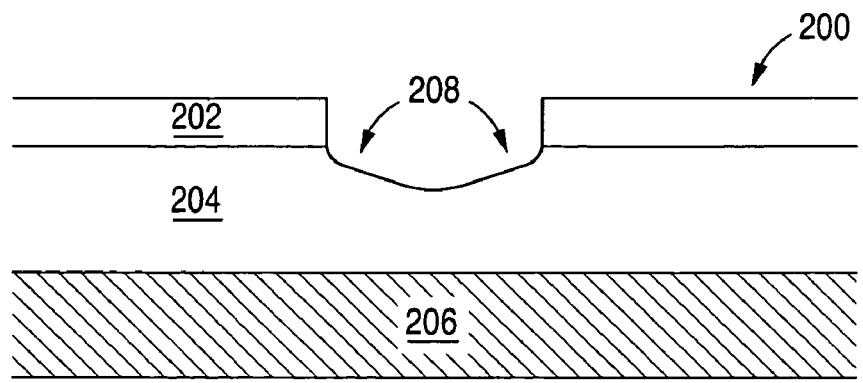
Figure 3C:
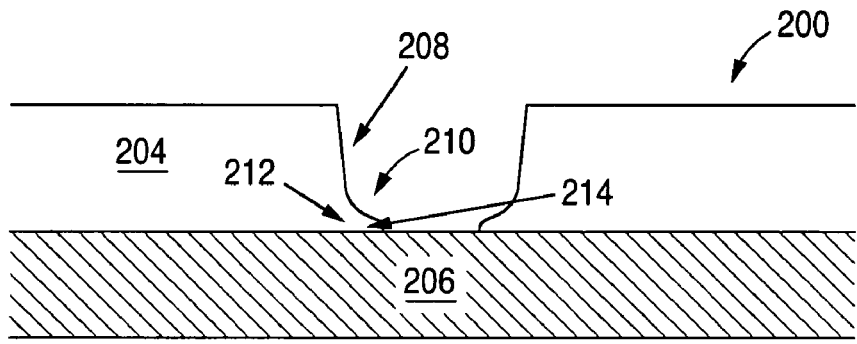

The horizontal feature 210 is preferably performed using the process described below, for purposes of A novel etch process can be used to create two distinct features from a single etch step. For example, FIG. 3 shows stages of an exemplary etch process that can be used to create a sharp, horizontal tip feature and a substantially vertical sidewall from a single etch step. FIG. 3(a) shows a material configuration 200 wherein a layer of tip material 204 resides on a substrate 206 of a different material. A mask layer 202 is deposited onto the layer of tip material 204, which can be removed after etch as shown in FIG. 3(c). This layered configuration can undergo an etching process, such as a single-step reactive ion etch (RIE), in order to etch a feature such as a pit into the layer of tip material 204. During the etch, substantially vertical sidewalls 208 begin to form in the pit as shown in FIG. 3(b). These sidewalls can be of any appropriate angle relative to the substrate layer, such as on the order of about 70° to about 90°. The terms "vertical" and "horizontal" are used for purposes of simplicity to imply orthogonal directionality, and should not be read as a limitation of the orientation of any device or process described herein.

If properly selected and controlled, a RIE process can have a much slower etch rate near a vertical edge of a material being etched than in a large horizontal area. Careful control of the etch can result in the formation of a sharp horizontal feature 210 as shown in FIG. 3(c). This feature 210 can have a base 212 along a substantially vertical sidewall 208 of the pit, and can have a tip point 214 or edge point opposite the base 212. Such a horizontal tip feature can have numerous potential uses in areas such as semiconductor, microscopic, and nanotechnology fabrication processes and technologies. The tip can be made of any of a number of appropriate materials, and can rest on a substrate of any of a number of different materials.

Figure 4:
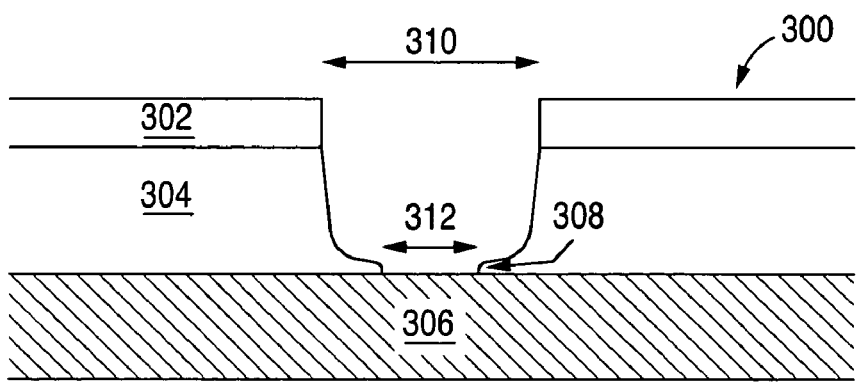
FIG. 4 is a cross-section showing the reduction of effective critical dimension spacing using a process in accordance with one embodiment of the present invention.

As discussed above, the use of such a process to create a tip feature can increase the effective resolution of a lithographic process. For example, FIG. 4 shows a configuration 300 having a layer of photoresist 302 over a layer of tip material 304 on a substrate 306. Existing photolithographic technology can only achieve certain minimum dimensions, as shown by the minimum separation 310 between portions of the photoresist layer 302. Using processes in accordance with embodiments of the present invention, the minimum effective feature size can be reduced by at least a factor of two relative to existing photolithographic techniques, such as down to on the order of ⅛ of a micron from about ¼ of a micron. As can be seen, the separation 312 between tips 308 is smaller than the minimum separation 310 of the photoresist that would otherwise be etched into the layer 304, but does not require any additional process steps to create. The critical dimension size can therefore be reduced without any additional time, energy, or expense using processes described herein.

The ability to manufacture such horizontal tip features arises from the fact that the etch of a film or layer in certain processes tends to go slower near an edge, such as an edge of a tip material layer located adjacent to an edge of a photoresist layer. A polymer buildup can occur near the resist sidewall during the etch, as is known in the art. Sidewall polymerization is typically used to control the profile, aspect ratio, or taper of a sidewall during etch. Processes in accordance with embodiments of the present invention can not only control the profile or taper of a vertical sidewall, but can also create a separate horizontal feature from the same etch step. The polymer buildup, if properly controlled, can cause the etch to not only proceed more slowly along the edge than elsewhere, but can also progress with a desired rate relative to the bulk etch such that a pre-determined etch lag is purposefully created. If the etch is halted in the appropriate location, or at the appropriate time, the etch will have cleared out the film or layer away from the edge, leaving a substantially vertical sidewall and a residual tip feature. The timing and precision of the process can be controlled using various process parameters, such as the rate of polymer generation and the etch chemistry.

While any appropriate etch technique can be used, it can be preferable in some embodiments to utilize a Reactive Ion Etch (RIE) process. The process parameters can include any appropriate parameters known in the art for the chemistry and materials of the etch process, as well as for the shape/size of the feature(s) to be created by the etch process. Etch process gases can include any appropriate process gases, such as but not limited to O2, CF4, SF6, CHF3, He, N2, Ar, Cl2, and SiCl4. Etch rates will vary depending on the gases and material(s) being etched, but often are in the range of from tens of nanometers to microns per minute. The pressure in an etch chamber can be any appropriate pressure, including but not limited to pressures on the order of 50 mTorr to 100 mTorr, or on the order of 0 mTorr to about 1000 mTorr, for example. The power setting for an RF supply can be any appropriate setting, including but not limited to powers on the order of about 100 W to about 600 W, or on the order of about 50 W to about 1500 W. Once the process gases, materials, and feature sizes have been determined, the process parameters can be adjusted to appropriately set the etch progression in the bulk and along the sidewalls.

In certain embodiments, it is necessary to properly end the etch process. While numerous ways exist to determine when to end the etch, two relatively simple examples include timing and endpoint approaches. In a timing approach, knowing the etch rate and thickness of the tip material, as well as the desired tip feature size, can allow for a determination of the length of time necessary to expose the tip material to the etch. The etch process can then be stopped after the determined period of time passes. In a second exemplary approach, which can be less dependent upon process variation in some embodiments, an endpoint can be utilized to properly end the etch. After the etch process reaches the substrate, a signal can be generated to measure the width of the open area in the tip material and/or the position of the receding edge of the tip material during the etch. The etch process can be stopped once the etch, or the edge of the tip material, reaches the desired tip position. It may be necessary to stop the etch process slightly before the etch reaches the desired position, in order to avoid inadvertent overetch.

Figure 5A:
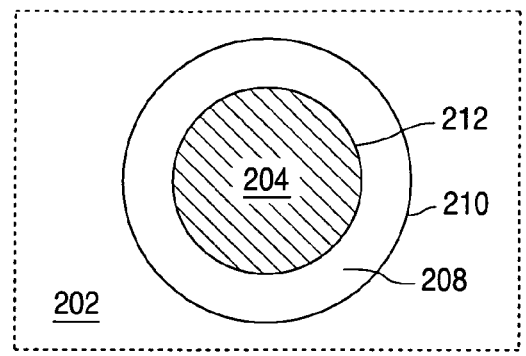
FIG. 5 is a top view of features made using the process of FIG. 3, including a (a) round feature or pit, (b) an edge feature, and (c) a narrow tip feature.
Figure 5B:
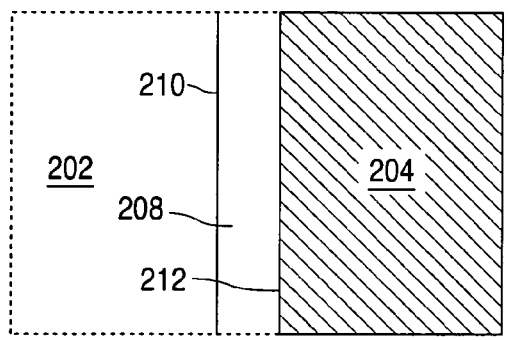
Figure 5C:
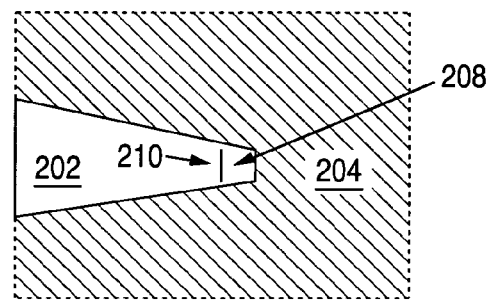

Horizontal tip features can be formed in any of a number of geometries, as shown for example in FIG. 5(a)-(c). For simplicity, reference numbers are carried over from FIG. 3 where appropriate. In FIG. 5(a), a circular pit is etched into the tip material layer 206, the pit having a ring-shaped horizontal tip feature 208 about the area of exposed substrate 204. FIG. 5(b) shows a horizontal tip feature 208 running along a substantially straight vertical edge of the tip layer 202. FIG. 5(c) shows a horizontal tip feature 208 at the end of a narrow, shaped layer of tip material 202, the tip feature being positioned over the substrate material 204.

The tip material used in the above examples can be any appropriate material, such as for example a nitride material, such as silicon nitride, or polysilicon. The substrate material can be any appropriate material, different than that of the tip material, such as for example single crystal silicon or polysilicon. The layer thickness of the tip material and substrate can be any appropriate thickness, except that the thickness of the tip material layer is preferably at least as great as the desired height of the horizontal tip feature at the base of the tip. The height and length of the tip can be dependent upon the process parameters and materials used, but in some embodiments are on the order of about 1.0 microns. The ratio of tip height to tip length can vary, and can be controlled or determined by the parameters of the etch process. Depending upon the precision and controllability of the etch process and the materials selected, tips with dimensions less than one micron can also be formed.

The etch process used, such as a reactive ion etch (RIE) process, should be selective to the tip material relative to the substrate. The etch can have additional etch steps in some embodiments, although only one etch step is necessary in most embodiments. Any etch process having an appropriate chemistry can be selected, as long as the etch process exhibits a lag, or lower etch rate, near a sidewall or substantially vertical feature. The etch process should be terminated at the appropriate point in the etch, prior to completion of a high-aspect ratio feature and/or a clearing of the tip material. Such a process can also be used on materials such as thin films to form extremely sharp features.

Figure 6:
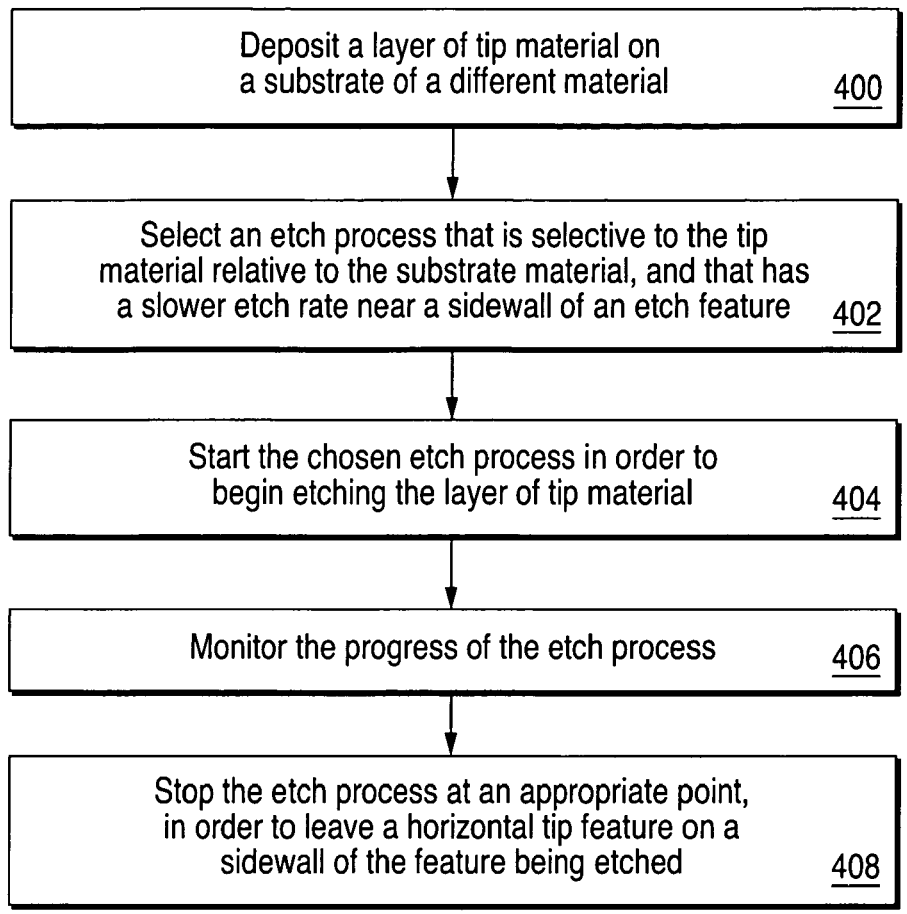
FIG. 6 is a flowchart showing a process in accordance with one embodiment of the present invention.

FIG. 6 shows steps of an exemplary process that can be used in accordance with embodiments of the present invention. In the process, a layer of tip material is deposited on a substrate of a different material 400. An etch process, such as an RIE process, is chosen that is selective to the tip material relative to the substrate material, and that has a slower etch rate near a sidewall of an etch feature 402. The chosen etch process is started in order to begin etching the layer of tip material 404. The progress of the etch process is monitored, either automatically, such as by a process monitor, or manually, such as by a process operator 406. The etch process is stopped at the appropriate point before completion, in order to leave a horizontal tip feature on a sidewall of the feature being etched 408.

Figure 7:
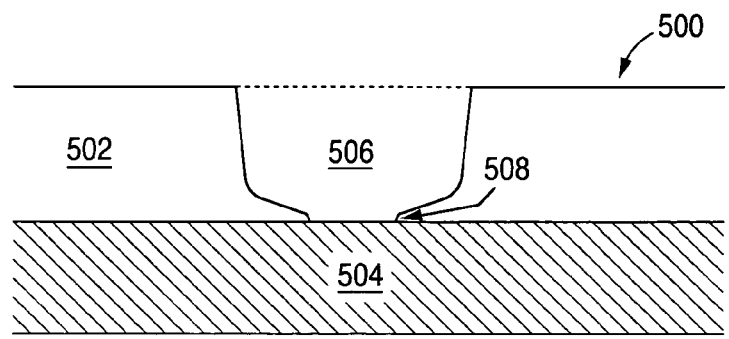
FIG. 7 is a cross-section view of a lens formed using a feature such as that shown in FIG. 3(c).

As shown in FIG. 7, sharp horizontal features in a tip material layer 502 can be used in a layer configuration 500 to shape an object such as a microscale lens, for example, by generating an appropriately shaped form or mold. As shown in the cross-section of FIG. 7, lens material 506 such as a plastic or polymer can be deposited into the void created by the etch process. The shape of the tip 508 can be controlled in order to impart the appropriate curvature unto the lens material 506. Shaping a lens in this manner can provide more options when creating a lens to, for example, focus light for the purpose of blowing a fuse in a circuit. A lens can also be shaped for semiconductor optical sensors, which typically require particularly and precisely shaped micro-lenses. While dome-shaped lenses can be made relatively easy, upside-down shaped domes can be significantly more difficult to form.

Processes in accordance with certain embodiments of the present invention allow upside-down shaped domes to be formed by filling an etch pit with an appropriate lens material after etch and allowing the lens material to cool and/or solidify.

Figure 8:
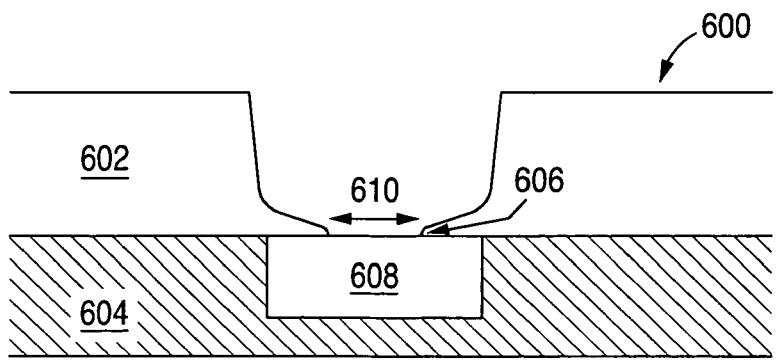
FIG. 8 is a cross-section showing an aperture for a photosensitive device, the aperture being formed in accordance with an embodiment of the present invention.

FIG. 8 shows an exemplary configuration 600, wherein an aperture of an appropriate dimension 610 is created between tips 606 formed from the tip material layer 602 over the substrate. A photo-active or photo-sensitive device 608 can be embedded in the substrate before etching, placed in the substrate after the etch, or positioned in place of the substrate after etch, adjacent the opening formed between the tips 606. The opening can then serve as a micro-aperture for the photo-sensitive device 608.

Although the present invention has been described with an exemplary embodiment, various changes and modifications may be suggested to one skilled in the art. It is intended that the present invention encompass such changes and modifications as fall within the scope of the appended claims.

What is claimed is:

1. A semiconductor processing method, comprising:
   forming a horizontal feature of tip material on a semiconductor substrate layer by:
   using an etch process to create an etch feature in a layer of tip material, the etch feature having substantially vertical sidewalls, the etch process having a slower etch rate near the sidewalls; and
   stopping the etch process in order to form the horizontal feature adjacent to the sidewalls; and
   depositing lens material within a void defined by the etch feature, the horizontal feature configured to shape a curved surface of a lens formed by the lens material;
   wherein a dimension of an opening defined by the horizontal feature is smaller than a minimum dimension obtainable by the etch process used to create the etch feature.

2. The method of claim 1, further comprising performing an etch step to remove the horizontal feature.

3. The method of claim 1, wherein the horizontal feature is less than one micron thick.

4. The method of claim 1, wherein the tip material is different than a material of the substrate layer.

5. The method of claim 1, further comprising selecting a duration of the etch process used to form the horizontal feature based on a desired size of the horizontal feature.

6. The method of claim 1, further comprising selecting the etch process, wherein the selected etch process is selective to the tip material relative to a material of the substrate layer.

7. The method of claim 1 wherein the etch process uses an etch process gas selected from the group consisting of $O_2$, $CF_4$, $SF_6$, $CHF_3$, He, $N_2$, Ar, $Cl_2$, and $SiCl_4$.

8. The method of claim 1, further comprising placing a photoresist mask over the layer of tip material, the photoresist mask acting as a mask for the etch process.

9. The method of claim 1, wherein the lens is configured to focus light to blow a fuse in a circuit.

10. The method of claim 1, wherein the lens is an upside-down dome lens.

11. A semiconductor structure, comprising:
a substrate of a first material;
a layer of a second material adjacent the substrate;
an etch feature in the layer of the second material, the etch feature having sidewalls substantially perpendicular to the substrate and a sharp tip feature adjacent the sidewalls and the substrate, such that a dimension of an opening defined by the sharp tip feature is smaller than a minimum dimension obtainable by a photolithographic process used to create the etch feature; and
a lens material within a space defined by the etch feature, the sharp tip feature configured to shape a curved surface of a lens formed by the lens material.

12. The structure of claim 11, wherein the sharp tip feature is less than one micron thick.

13. The structure of claim 11, wherein the second material is different than the first material.

14. The structure of claim 11, wherein the sharp tip feature is substantially horizontal and runs along a substantially straight vertical edge of the second material.

15. A method comprising:
etching a layer of tip material over a semiconductor substrate layer using an etch process, the layer of tip material etched to form sidewalls and a tip feature extending from the sidewalls, the etch process having a slower etch rate near the sidewalls; and
depositing lens material within a void defined by the sidewalls and tip feature of the tip material, the tip feature configured to shape a curved surface of a lens formed by the lens material;
wherein a dimension of an opening defined by the tip feature is smaller than a minimum dimension obtainable by the etch process.

16. The method of claim 15, further comprising:
depositing a layer of photoresist material over the layer of tip material; and
forming an opening in the layer of photoresist material;
wherein the layer of tip material is etched through the opening in the layer of photoresist material.

17. The method of claim 16, wherein the opening in the layer of photoresist material is formed using a photolithographic process, the opening having a minimum dimension obtainable using the photolithographic process.

18. The method of claim 17, wherein a minimum effective feature size obtainable using the tip feature is reduced by at least a factor of two relative to the minimum dimension of the photolithographic process.

19. The method of claim 15, further comprising:
performing an etch to remove the tip feature.

20. The method of claim 15, wherein the tip feature is less than one micron thick.

21. The method of claim 15, wherein the etch process comprises a Reactive Ion Etch (RIE) process.

22. The method of claim 15, further comprising:
selecting the etch process to etch the layer of tip material, the selected etch process selective to the tip material relative to a material of the substrate layer.

23. The method of claim 15, further comprising:
selecting a duration of the etch process based on a desired size of the tip feature to be formed.

* * * * *